US012777596B2

(12) United States Patent
Woo et al.

(10) Patent No.: US 12,777,596 B2
(45) Date of Patent: Oct. 27, 2026

(54) DISPLAY DEVICE COMPRISING A BOTTOM PLATE HAVING A STACKED STRUCTURE AND APERTURE PATTERNS

(71) Applicant: LG Display Co., Ltd., Seoul (KR)

(72) Inventors: Sangmin Woo, Paju-si (KR); JiSoon Oh, Paju-si (KR); Hyeonggwang An, Paju-si (KR); Jaewoo Lee, Paju-si (KR); ShinSuk Lee, Paju-si (KR); Namseok Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 85 days.

(21) Appl. No.: 18/898,127

(22) Filed: Sep. 26, 2024

(65) Prior Publication Data

US 2025/0275071 A1 Aug. 28, 2025

(30) Foreign Application Priority Data

Feb. 28, 2024 (KR) ........................ 10-2024-0029128

(51) Int. Cl.
*H05K 5/00* (2025.01)
*H05K 5/02* (2006.01)

(52) U.S. Cl.
CPC .................................. *H05K 5/0217* (2013.01)

(58) Field of Classification Search
CPC ... H05K 5/0217; H05K 1/147; H04M 1/0216; H04M 1/0268; G06F 1/1652; G09F 9/301; G09F 9/33; G09F 9/335; G09F 9/35; H10K 59/87; H10K 71/50; H10K 77/111
See application file for complete search history.

(56) References Cited

U.S. PATENT DOCUMENTS 10,164,208 B2 * 12/2018 Lee ......................... B32B 15/04
10,485,116 B2 * 11/2019 Kim ...................... G06F 1/1641
10,558,242 B2 * 2/2020 Kim ...................... G06F 1/1681
(Continued)

FOREIGN PATENT DOCUMENTS

CN 109979323 A 7/2019
CN 114170913 A 3/2022
(Continued)

OTHER PUBLICATIONS

Taiwan Intellectual Property Office, Office Action, Taiwanese Patent Application No. 113135797, Nov. 10, 2025, 21 pages.
(Continued)

*Primary Examiner* — Rockshana D Chowdhury
(74) *Attorney, Agent, or Firm* — Fenwick & West LLP

(57) ABSTRACT

Disclosed is a display device in which bubbles generated in a bonding process of a display module can be eliminated, which comprises a foldable display device comprising a system middle frame capable of folding relative to a folding axis, and a foldable display module having a folding area that is bonded with the system middle frame and capable of folding relative to the folding axis, and a plurality of flat areas connected through the folding area, wherein the foldable display module comprises a display panel including the plurality of flat areas and the folding area, and a bottom plate that is bonded between the display panel and the system middle frame and includes a plurality of folding patterns disposed in the folding area and a plurality of aperture patterns disposed in the plurality of flat areas.

20 Claims, 12 Drawing Sheets

(56) References Cited

U.S. PATENT DOCUMENTS

| | | | | |
|---|---|---|---|---|
| 10,936,012 | B2* | 3/2021 | Kim | G02F 1/133305 |
| 11,395,415 | B2* | 7/2022 | Gu | G06F 1/1601 |
| 11,656,655 | B2* | 5/2023 | Shin | G06F 1/1641<br>361/679.27 |
| 11,823,595 | B2* | 11/2023 | Wang | G06F 1/1616 |
| 12,032,408 | B2* | 7/2024 | Lee | G06F 1/1652 |
| 12,093,082 | B2* | 9/2024 | Park | G06F 1/1652 |
| 12,105,564 | B2* | 10/2024 | Kim | G06F 1/1652 |
| 12,159,557 | B2* | 12/2024 | Park | G09F 9/301 |
| 12,162,255 | B2* | 12/2024 | Cheng | B32B 15/043 |
| 12,222,766 | B2* | 2/2025 | Li | G06F 1/1637 |
| 12,228,972 | B2* | 2/2025 | Kang | G06F 1/1652 |
| 12,232,408 | B2* | 2/2025 | Park | G02F 1/1333 |
| 12,235,681 | B2* | 2/2025 | Park | F16C 11/12 |
| 12,314,084 | B2* | 5/2025 | Li | G06F 1/1616 |
| 12,493,325 | B2* | 12/2025 | Kim | D03D 15/267 |
| 2019/0196548 | A1* | 6/2019 | Kim | G06F 1/1681 |
| 2019/0200466 | A1 | 6/2019 | Kim | |
| 2019/0204867 | A1 | 7/2019 | Song et al. | |
| 2019/0369668 | A1 | 12/2019 | Kim et al. | |
| 2019/0378455 | A1 | 12/2019 | Kim et al. | |
| 2021/0174711 | A1 | 6/2021 | Cho et al. | |
| 2021/0217975 | A1* | 7/2021 | Gu | G09F 9/30 |
| 2021/0407344 | A1 | 12/2021 | Lee et al. | |
| 2022/0206537 | A1* | 6/2022 | Park | G06F 1/1652 |
| 2023/0018777 | A1* | 1/2023 | Park | G06F 1/1656 |
| 2023/0051260 | A1* | 2/2023 | An | H04M 1/18 |
| 2023/0096985 | A1 | 3/2023 | Chen | |
| 2023/0182433 | A1* | 6/2023 | Park | B32B 3/30<br>428/12 |
| 2023/0354533 | A1* | 11/2023 | Fu | H04M 1/0268 |
| 2023/0393626 | A1* | 12/2023 | Kim | G06F 1/1652 |
| 2024/0143026 | A1* | 5/2024 | Song | G06F 1/1616 |
| 2024/0418208 | A1* | 12/2024 | Shi | F16C 11/04 |
| 2025/0275071 | A1* | 8/2025 | Woo | H04M 1/0268 |

FOREIGN PATENT DOCUMENTS

| | | | |
|---|---|---|---|
| CN | 114333589 | A | 4/2022 |
| CN | 116863820 | A | 10/2023 |
| CN | 117475753 | A | 1/2024 |
| JP | 2023-512498 | A | 3/2023 |
| JP | 2023-523103 | A | 6/2023 |
| JP | 2023-107249 | A | 8/2023 |
| JP | 2023-166415 | A | 11/2023 |
| KR | 10-2019-0003257 | A | 1/2019 |
| KR | 10-2021-0150942 | A | 12/2021 |
| KR | 10-2529149 | B1 | 5/2023 |

OTHER PUBLICATIONS

Japan Patent Office, Office Action, Japanese Patent Application No. 2024-163566, Jun. 12, 2025, 18 pages.

European Patent Office, Extended European Search Report, European Patent Application No. 24202943.7, Mar. 11, 2025, 13 pages.

* cited by examiner

DISPLAY DEVICE COMPRISING A BOTTOM PLATE HAVING A STACKED STRUCTURE AND APERTURE PATTERNS

CROSS-REFERENCE TO RELATED APPLICATION

This application claims the benefit of the Republic of Korea Patent Application No. 10-2024-0029128 filed on Feb. 28, 2024, which is hereby incorporated by reference in its entirety.

BACKGROUND

Technical Field

The present disclosure relates to a display device.

Discussion of the Related Art

Electroluminescence display (ESD) devices have the advantages of high brightness, low drive voltage, ultra-thinness, and freedom of shape by using light-emitting elements.

Electroluminescent display devices can be applied to display devices in which the display area can be folded or unfolded depending on the application. In display devices, bubbles generated during the lamination process can cause screen defects, so a bubble removal method is required.

The display device may have an afterimage phenomenon caused by the heating of circuit components, so a heat dissipation plan is required.

SUMMARY

Accordingly, the present disclosure is directed to providing a display device that substantially obviate one or more problems due to limitations and disadvantages of the related art.

An embodiment of the present disclosure provides a display device in which bubbles generated in a bonding process of a display module can be eliminated, thereby improving screen defects.

An embodiment of the present disclosure provides a display device capable of improving heat dissipation characteristics of a display module.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In accordance with an embodiment of the present disclosure, a foldable display device may include a system middle frame capable of folding relative to a folding axis; and a foldable display module having a folding area that is bonded with the system middle frame and capable of folding relative to the folding axis, and a plurality of flat areas connected through the folding area, wherein the foldable display module comprises a display panel including the plurality of flat areas and the folding area, and a bottom plate that is bonded between the display panel and the system middle frame and includes a plurality of folding patterns disposed in the folding area and a plurality of aperture patterns disposed in the plurality of flat areas, and wherein each of the plurality of aperture patterns comprising an outer hole pattern and an inner hole pattern associated with the outer hole pattern.

In accordance with an embodiment of the present disclosure, a foldable display device may include a display panel comprising a plurality of flat areas, and a folding area that is disposed between the plurality of flat areas and capable of folding relative to a folding axis; a bottom plate bonded to a back surface of the display panel, and including a plurality of folding patterns corresponding to the folding area and a plurality of aperture patterns corresponding to the plurality of flat regions, the plurality of aperture patterns comprising an outer hole pattern and an inner hole pattern having a size different from the outer hole pattern; and a system middle frame bonded to the bottom plate by a plurality of adhesives disposed separately on a back surface of the bottom plate corresponding to the plurality of flat areas, and capable of folding relative to the folding axis.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
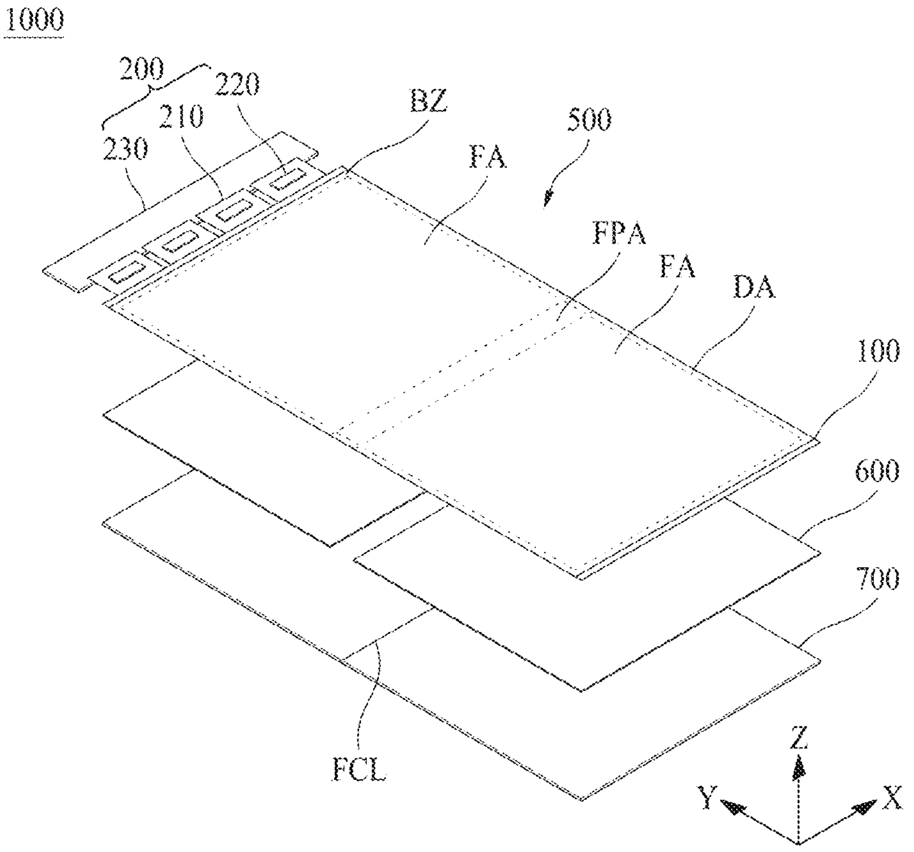
FIGS. 1 and 2 are perspective views schematically illustrating an example of a configuration before and after bonding of a foldable display device, according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

In describing a position relationship, for example, when a position relation between two parts is described as "on", "over", "under", and "next", one or more other parts may be disposed between the two parts unless a more limiting term, such as "just" or "direct(ly)" is used.

In describing a time relationship, for example, when the temporal order is described as, "after", "subsequent", "next", and "before", a case which is not continuous may be included unless a more limiting term, such as "just", "immediate(ly)", or "direct (ly)" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first", "second", "A", "B", "(a)", "(b)", etc., may be used. These terms are intended to identify the corresponding elements from the other elements, and basis, order, sequence, or number of the corresponding elements should not be defined or limited by these terms. As for the expression that an element or a layer is "connected", "coupled", or "adhered" to another element or layer, the element or layer may not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together in co-dependent relationship.

Hereinafter, the embodiment of the present disclosure will be described with reference to the accompanying drawings. Since a scale of each of elements shown in the accompanying drawings is different from an actual scale for convenience of description, the present disclosure is not limited to the shown scale. Further, all the components of each display apparatus according to all embodiments of the present disclosure are operatively coupled and configured.

Figure 2:
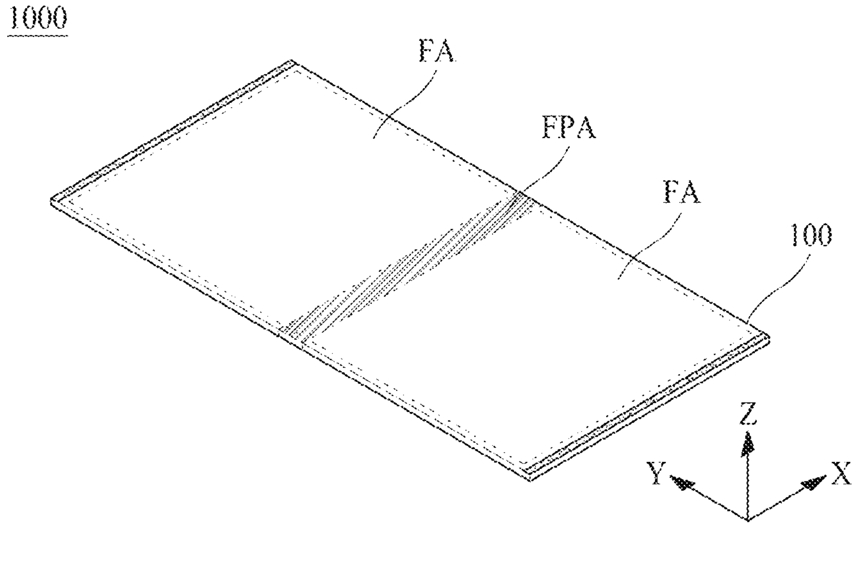
Figure 3:
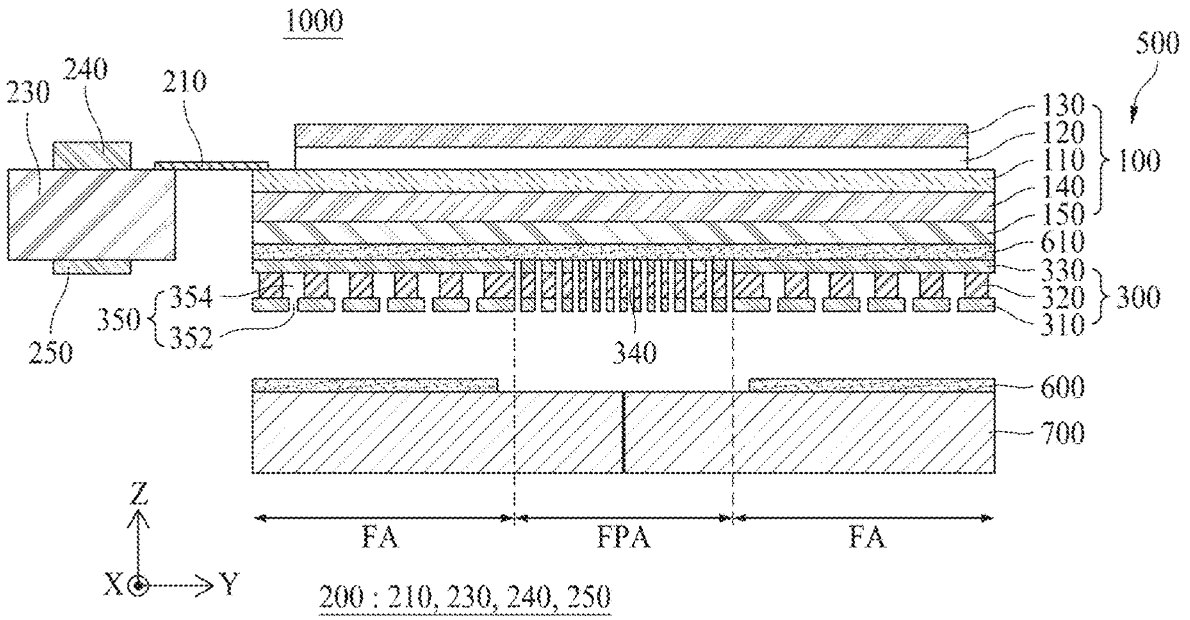
FIGS. 3 and 4 are cross-sectional views schematically illustrating an example of a configuration before and after bonding of a foldable display device, according to one embodiment of the present disclosure.
Figure 4:
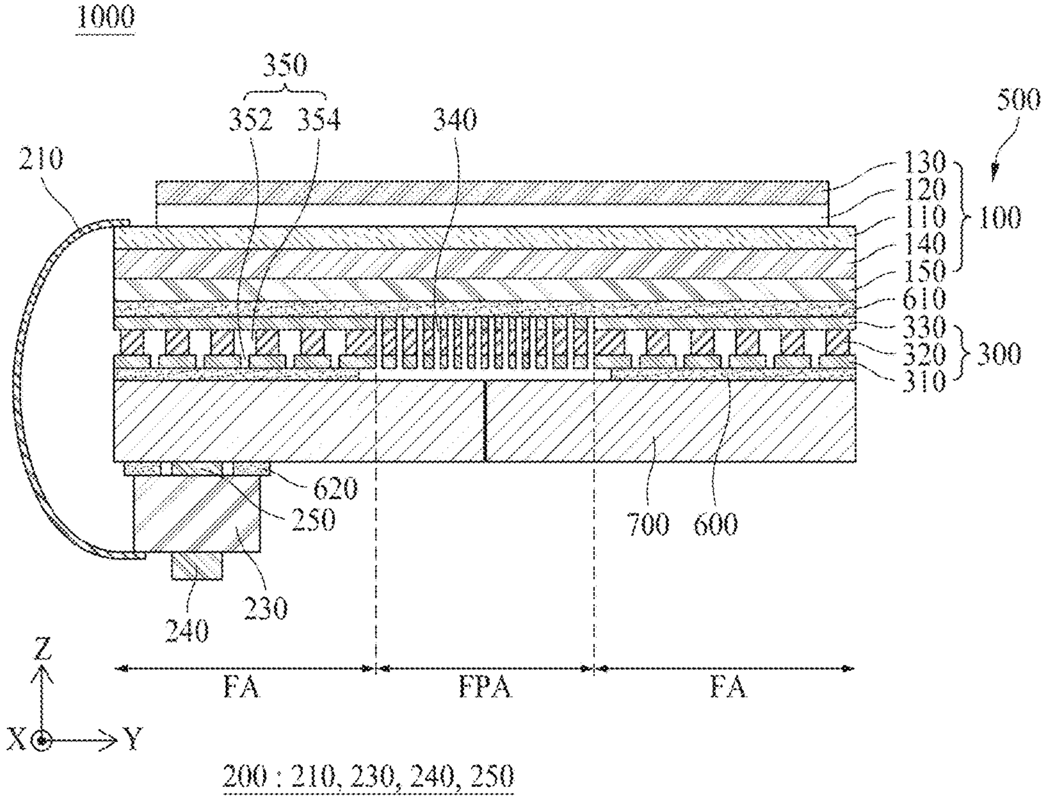
Figure 5:
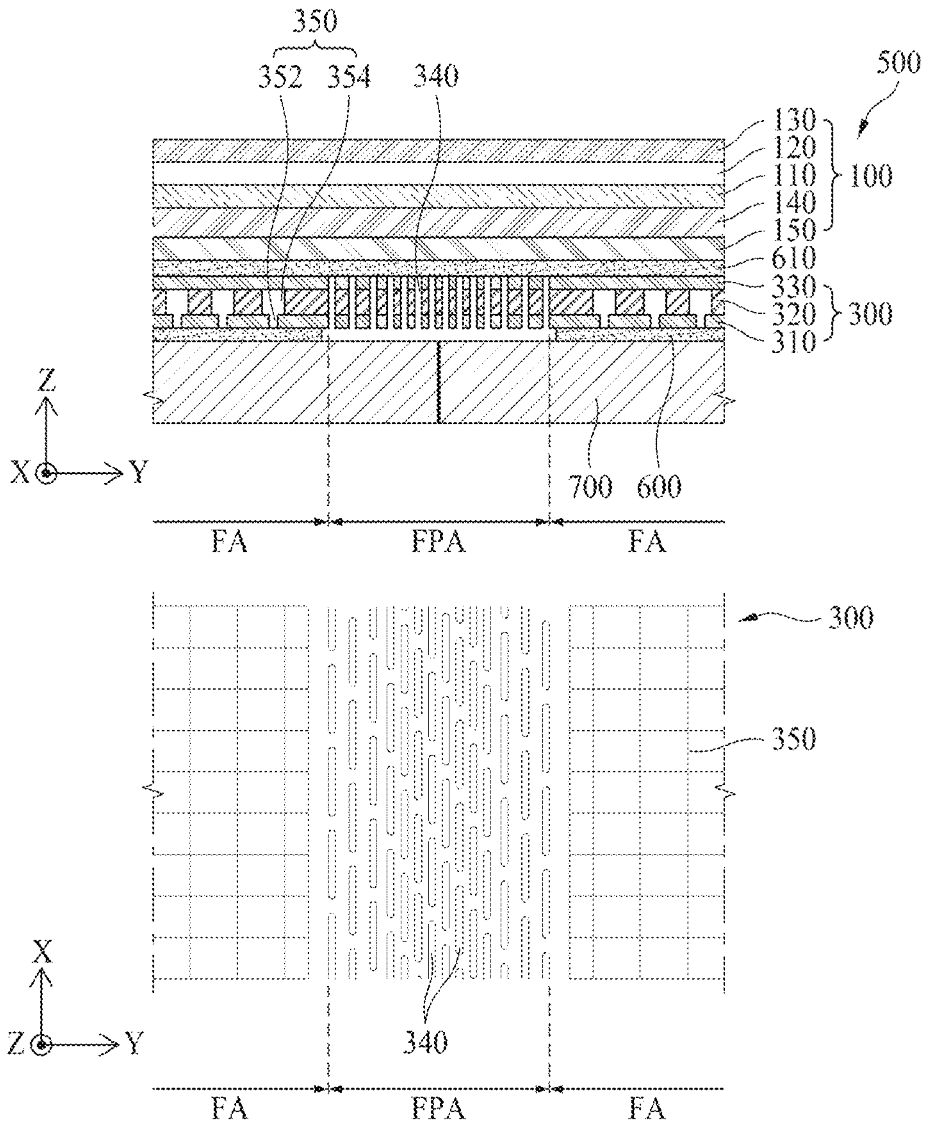
FIG. 5 is a diagram illustrating an example of a cross-sectional structure of a foldable display device and a back-side structure of a bottom plate, according to one embodiment of the present disclosure.
Figure 6:
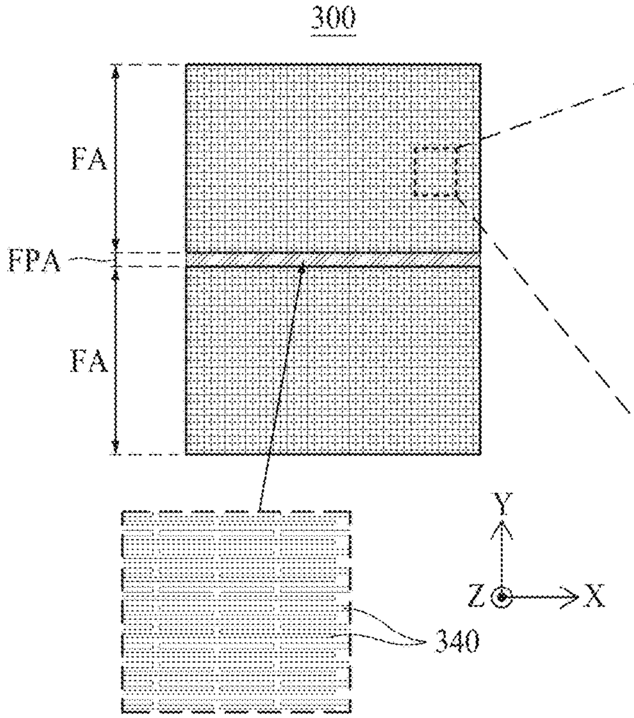
FIG. 6 is a plan view illustrating an example of a backside structure of a bottom plate according to one embodiment of the present disclosure.
Figure 7A:
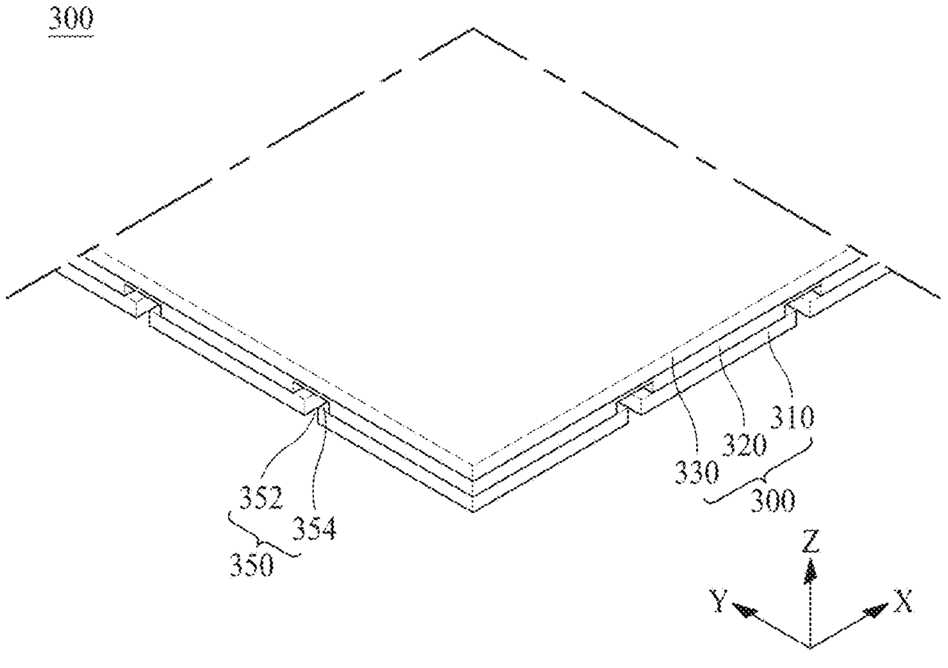
FIGS. 7A and 7B are perspective views illustrating an example of a structure viewed from a top surface and a back surface, respectively, of a bottom plate according to one embodiment of the present disclosure.
Figure 7B:
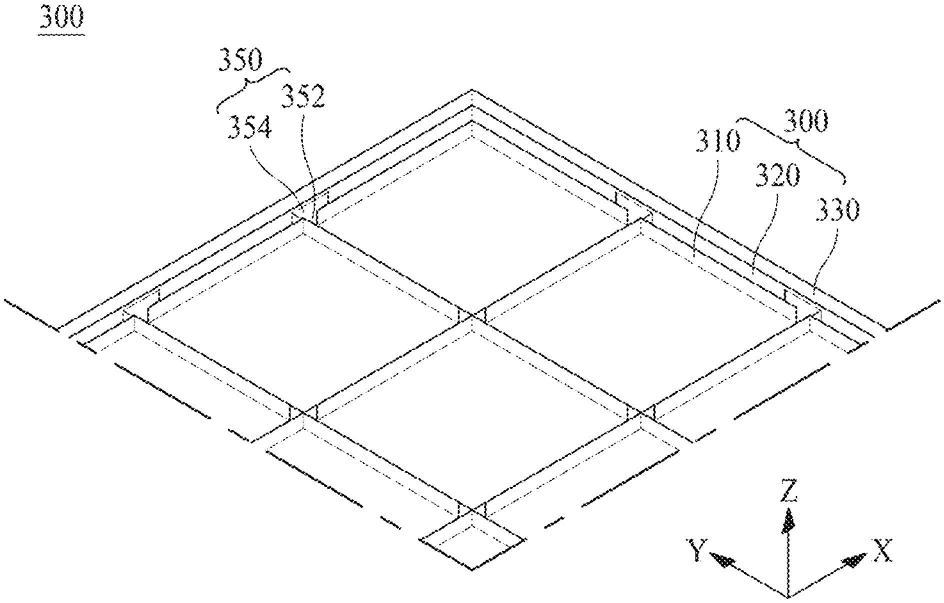
Figure 8:
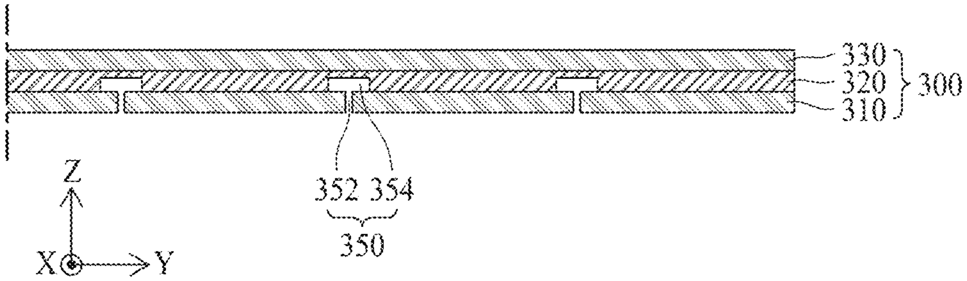
FIG. 8 is a cross-sectional view illustrating an example of a portion of a bottom plate according to one embodiment of the present disclosure.

FIGS. 1 and 2 are perspective views schematically illustrating an example of a configuration before and after bonding of a foldable display device, according to one embodiment of the present disclosure. FIGS. 3 and 4 are cross-sectional views schematically illustrating an example of a configuration before and after bonding of a foldable display device, according to one embodiment of the present disclosure. FIG. 5 is a diagram illustrating an example of a cross-sectional structure of a foldable display device and a backside structure of a bottom plate, according to one embodiment of the present disclosure. FIG. 6 is a plan view illustrating an example of a backside structure of a bottom plate according to one embodiment. FIGS. 7A and 7B are perspective views illustrating an example of a structure viewed from a top surface and a back surface, respectively, of a bottom plate according to one embodiment of the present disclosure. FIG. 8 is a cross-sectional view illustrating an example of a portion of a bottom plate according to one embodiment of the present disclosure.

Referring to FIGS. 1 to 8, a foldable display device 1000 according to one embodiment may include a foldable display module 500 including a display panel 100, a system middle frame 700 that is bonded to the foldable display module 500 via an adhesive 600 and is foldable relative to a folding axis FCL.

In FIGS. 1 to 8, the first direction X and second direction Y may be a horizontal direction and a vertical direction in a plane of the display device 1000, and the third direction Z may be a thickness direction of the display device 1000.

The foldable display module 500, according to one embodiment, may include a display panel 100, a bottom plate 300 disposed on a back surface of the display panel 100, and a driving circuit unit 200 connected to a bezel region BZ of the display panel 100 to drive the display panel 100.

The foldable display module 500 may be bonded to the system middle frame 700 via an adhesive 600 disposed on a top surface of the system middle frame 700, and the circuit film 210 of the driving circuit unit 200 may be bent so that a printed circuit board (PCB) 230 is disposed on the back surface of the system middle frame 700 for assembly.

The foldable display device 1000, according to one embodiment, may include a plurality of flat areas FAs and a folding area FPA disposed between and connected to the plurality of flat areas FAs. The folding area FPA of the foldable display device 1000 may be disposed along the folding axis FCL of the system middle frame 700. The foldable display device 1000 according to one embodiment may include, but is not limited to, one folding area FPA disposed between two flat areas FAs. The foldable display device 1000 according to one embodiment may include three or more flat areas FAs, and two or more folding areas FPAs including folding areas FPAs disposed between adjacent flat areas FAs.

The foldable display device 1000 may be in a folding state where the folding areas FPAs are folded, and in an unfolding state where the folding areas FPAs are unfolded, relative to the folding axis FCL of the system middle frame 700. The foldable display device 1000 according to one embodiment may be folded in an in-folding manner such that the display area DA of the display panel 100 faces inwardly. The foldable display device 1000 according to one embodiment may be folded in an out-folding manner with the back side facing inward.

The foldable display device 1000 according to one embodiment may fold in a second direction Y relative to the folding axis FCL in the first direction X, but not limited to, may fold in the first direction X when the direction of the folding axis FCL is in the second direction Y.

The display panel 100, according to one embodiment, may be a flexible display panel. The flexible display panel may be an electroluminescent display panel, a micro light emitting diode display panel, or a liquid crystal display panel. The electroluminescent display panel may be an Organic Light Emitting Diode (OLED) display panel, a Quantum-dot Light Emitting Diode display panel, or an Inorganic Light Emitting Diode display panel.

The display panel 100, according to one embodiment, may include a display area DA on which an image is displayed, and a bezel region BZ located at a periphery of the display area DA. The display panel 100, according to an embodiment, may further include an array of touch sensors disposed on the display area DA while being overlapped with the display area DA. The display panel 100, according to one embodiment, may provide a touch sensing function that senses the presence of a user's touch and the coordinates of the touch, along with a display function that displays an image.

The display panel 100, according to one embodiment, may include a display unit 110 disposed on a back plate 140, a polarizer 120 disposed on the display unit 110, and a cover film 130 disposed on the polarizer 120. The display panel 100, according to one embodiment, may further include other top layers disposed on the display unit 110 that have optical property enhancement or protective functions. The display panel 100 according to one embodiment may further comprise a support plate 150 disposed on the back side of the back plate 140, and may further comprise another lower layer having a reinforcing or protective function. The support plate 150 may be represented as a top plate.

The display unit 110 of the display panel 100 according to one embodiment may include a pixel array comprising a plurality of subpixels disposed on the back plate 140, an encapsulation layer sealing the pixel array, and a touch sensor array comprising sensor electrodes disposed on the encapsulation layer. The pixel array may include a circuit element layer comprising a plurality of thin film transistors and a plurality of signal lines, and a light emitting element layer comprising a plurality of light emitting elements disposed on the circuit element layer and each embodying a plurality of subpixels. The circuit element layer may include a gate driver for driving a gate line of the plurality of signal lines. The gate driver may be disposed in the bezel region BZ, or may be distributed in the display region DA and the bezel region BZ.

The plurality of thin-film transistors disposed in the display unit 110 of the display panel 100 may include at least one of an LTPS transistor utilizing a low temperature poly silicon (LTPS) semiconductor, and an oxide transistor utilizing a metal-oxide semiconductor. The display panel 100 according to one embodiment may be configured to coexist LTPS transistors and oxide transistors to reduce power consumption.

The bottom plate 300, according to one embodiment, may be attached via adhesive 610 to a back surface of the display panel 100 and may provide folding properties to the display panel 100. The bottom plate 300 may provide additional rigidity to the foldable display module 500, and may provide heat dissipation. For example, the bottom plate 300 may be represented by a metal plate or metal sheet. The bottom plate 300 may have a laminated structure of a plurality of metal layers 310, 320, 330.

The bottom plate 300, according to one embodiment, may include a folding area FPA in which a folding pattern 340 is disposed, and a flat area FA located on either side of the folding area FPA in which a bubble venting pattern 350 is disposed. The bubble venting pattern 350 may be represented as an aperture pattern or an inner pattern.

The back surface of the bottom plate 300, corresponding to the back surface of the foldable display module 500, may be bonded to the top surface of the system middle frame 700 via adhesive 600 corresponding to each of the plurality of flat areas FA.

The adhesive 600 may be disposed on the top surface of the system middle frame 700, separated to overlap each of the plurality of flat areas FAs of the foldable display module 500, and may be non-overlapping with the folding area FPA.

The foldable display module 500 may have the entirety of the plurality of flat areas FAs bonded to the top surface of the system middle frame 700 via the plurality of adhesives 600, thereby increasing the adhesion of the foldable display module 500 to the system middle frame 700.

The system middle frame 700 may support the foldable display module 500 to provide additional rigidity and may have a foldable structure relative to the folding axis FCL. The system middle frame 700 according to one embodiment may include a plurality of plates, and the plurality of plates may be joined via hinges disposed in the folding area (FPA) to have a foldable structure relative to the folding axis FCL.

The driving circuit unit 200 may include a plurality of circuit films 210 connected to the bezel region BZ of the display panel 100 and each having a plurality of drive integrated circuits (ICs) 220 mounted thereon, and a printed circuit board (PCB) 230 connected to the plurality of circuit films 210 and having a plurality of drive ICs 240, 250 mounted thereon. The circuit films 210 may be flexible circuits, such as chip on film (COF) or flexible printed circuits (FPC). The drive IC 220 mounted on the circuit film 210 can be a data driver that drives the data lines of the display panel 100. The plurality of drive ICs 240, 250 mounted on the PCB 230 may include timing controllers, power management circuits, touch drive circuits, touch controllers, and the like.

The PCB 230, which is disposed on and overlapped with the back surface of the system middle frame 700, may be attached and secured to the back surface of the system middle frame 700 via adhesive 620.

The adhesives 600, 610, 620 according to one embodiment may include at least one of an Optical Clear Adhesive (OCA), a Pressure Sensitive Adhesive (PSA), a thermo-responsive adhesive, a conventional adhesive, and a double-sided tape.

The bottom plate 300 according to one embodiment may have a stacked structure of a plurality of metal layers 310, 320, 330. The bottom plate 300 according to one embodiment may have a clad metal structure with first to third metal layers 310, 320, 330 stacked, but is not limited to. The bottom plate 300 may include first and third metal layers 310, 330 made of a metal or non-ferrous metal with rigid reinforcement material, and a second metal layer 320 made of a non-ferrous metal disposed between the first and third metal layers 310, 330 and made of a material with better heat dissipation properties. For example, the first and third metal layers 310, 330 may include at least one of stainless steel (SUS), magnesium (Mg), titanium (Ti), and other metallic materials. The second metal layer 320 may include at least one of a metallic material such as aluminum (Al), copper (Cu), and the like. The embodiments described herein are not limited to this.

The plurality of folding patterns 340 disposed in the folding area FPA of the bottom plate 300 according to one embodiment may have the form of a plurality of slits penetrating the plurality of metal layers 310, 320, 330. The size, spacing, and number of the plurality of folding patterns 340 may change depending on the location, taking into account the folding characteristics and elastic resilience of the foldable display device 1000.

In the bottom plate 300 according to one embodiment, the plurality of folding patterns 340 may include a plurality of slit patterns extending along a first direction X, which is in the direction of the folding axis FCL of the folding area FPA, and disposed side-by-side in a second direction Y, which is orthogonal to the folding axis FCL. The plurality of folding patterns 340 may improve folding characteristics by decreasing the spacing between the folding patterns 340 from the folding area FPA along the second direction Y toward the center of the folding axis FCL.

The plurality of aperture patterns (hereinafter referred to as bubble venting patterns) 350 disposed in the flat area FA of the bottom plate 300 may have the form of double holes provided in some metal layers 310, 320 of the plurality of metal layers 310, 320, 330. The plurality of bubble venting patterns 350 may be connected in a matrix form in the flat area FA to serve as passageways for bubble vent, and may perform a heat dissipation function to dissipate heat.

Each of the plurality of bubble venting patterns 350 in the bottom plate 300, according to one embodiment, can include an outer hole pattern 352 provided in the outer first metal layer 310 located on the back side of the bottom plate 300, and an inner hole pattern 354 provided in the inner second metal layer 320 and associated with the outer hole pattern 352. For example, the outer hole pattern 352 may be different from the inner hole pattern 354. The outer hole pattern 352 may have a smaller width than the inner hole pattern 354. After the bottom plate 300 is bonded to the system middle frame 700 via the adhesive 600, the flat area FA of the bottom plate 300 may include a bonding area where the adhesive 600 is bonded and a nonbonding area where the adhesive 600 is not bonded by the outer hole pattern 352. In the flat area FA of the bottom plate 300, the area of the bonding area of the adhesive 600 can be larger than the area of the nonbonding area by the outer hole pattern 352, and the width of the outer hole pattern 352 can be smaller than the width of the inner hole pattern 354 to minimize the area of the nonbonding area of the adhesive 600.

In one embodiment, a material having a larger etch rate of the second metal layer 320 than the first metal layer 310 of the bottom plate 300 can be utilized, and the inner hole pattern 354 can be formed to have a larger width than the outer hole pattern 352 by over-etching the second metal layer 320 than the first metal layer 310.

Accordingly, the bottom plate 300 according to one embodiment can further improve the bubble exhaust function and heat dissipation function by the inner hole pattern 354 having a larger width than the outer hole pattern 352.

Furthermore, the bottom plate 300 according to one embodiment can minimize or at least reduce the increase in the nonbonding area where the adhesive 600 is not bonded to the bottom plate 300 by the outer hole pattern 352 having a smaller width than the inner hole pattern 354. Accordingly, the bottom plate 300 according to one embodiment can minimize the decrease in the bonding area of the adhesive 600 disposed between the foldable display module 500 and the system middle frame 700 to prevent degradation of adhesion, thereby preventing the movement of the foldable display module 500 due to vibration or impact, thereby preventing the occurrence of poor screen creasing.

The folding pattern 340 disposed in the folding area FPA of the bottom plate 300 according to one embodiment may be formed by utilizing a double-sided etching method, and the bubble venting pattern 350 disposed in the flat area FA may be formed in the same process by utilizing a single-sided etching method.

FIGS. 9 to 12 are perspective views illustrating examples of the backside structure of a bottom plate according to various embodiments of the present disclosure.

Figure 9:
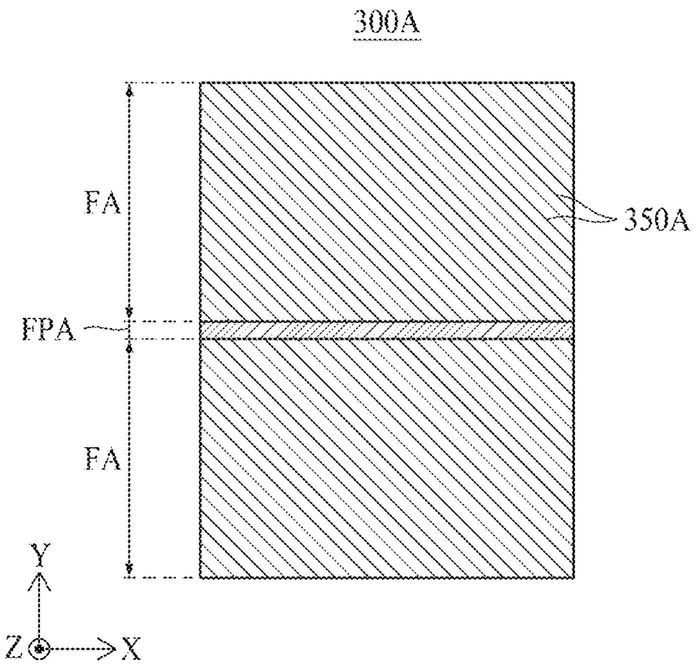
FIGS. 9 to 12 are perspective views illustrating examples of the backside structure of a bottom plate according to various embodiments of the present disclosure.

Referring to FIG. 9, the bottom plate 300A according to one embodiment may include a plurality of bubble venting patterns 350A disposed in the form of diagonal stripes in a plurality of flat areas FA.

Figure 10:
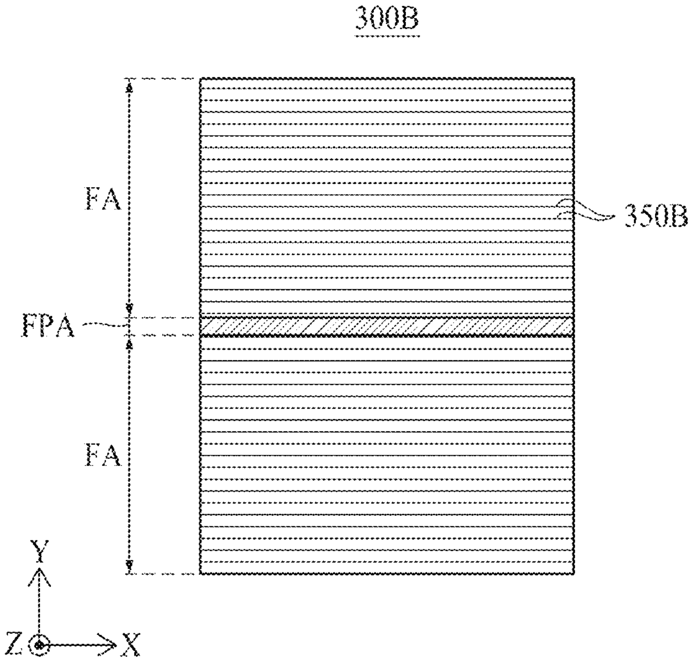

Referring to FIG. 10, the bottom plate 300B according to one embodiment may include a plurality of bubble venting patterns 350B disposed in the form of stripes in a first direction X in a plurality of flat areas FA.

Figure 11:
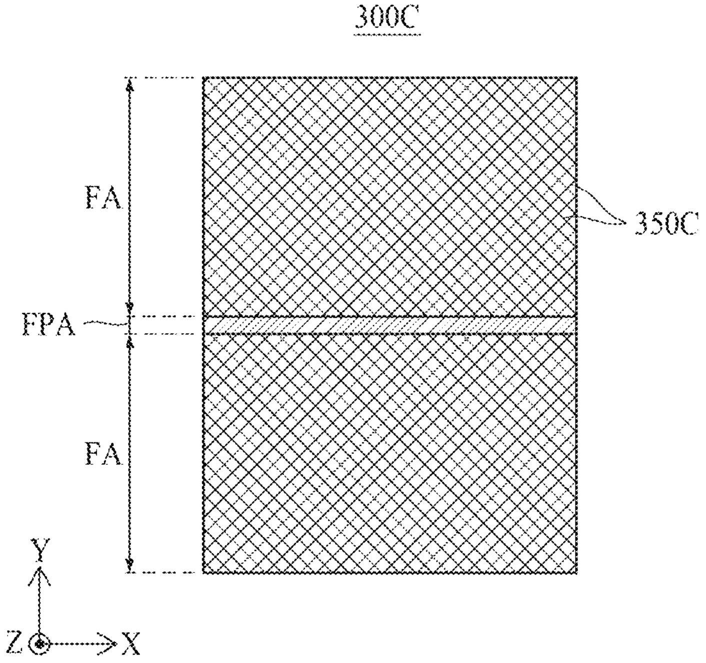

Referring to FIG. 11, the bottom plate 300C according to one embodiment may include a plurality of bubble venting patterns 350C disposed in a matrix form intersecting diagonally in a plurality of flat areas FA.

Figure 12:
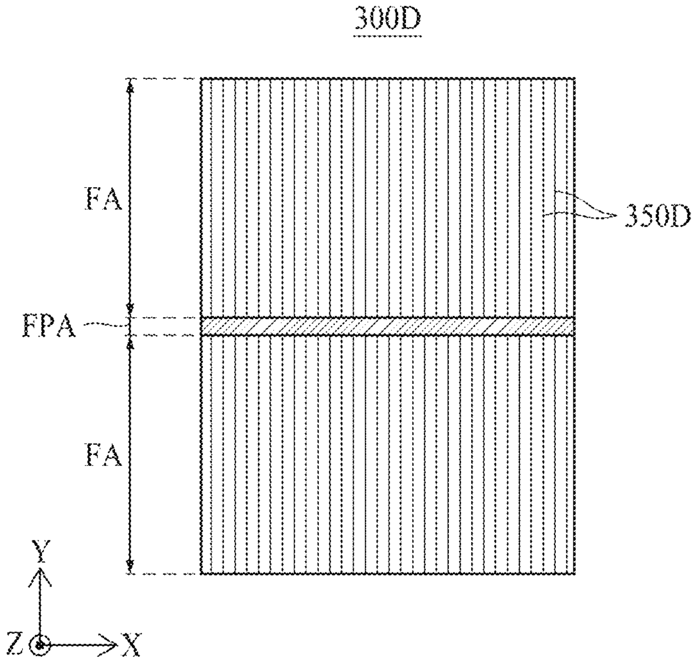

Referring to FIG. 12, the bottom plate 300D according to one embodiment may include a plurality of bubble venting patterns 350D disposed in the form of stripes in a second direction Y in a plurality of flat areas FA.

Figure 13:
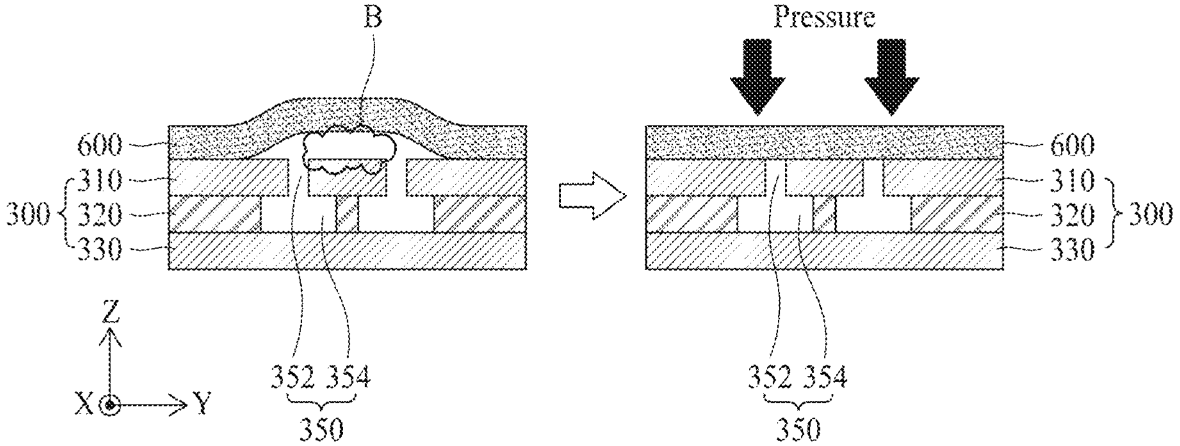
FIG. 13 is a schematic diagram illustrating an example of a bubble evacuation process during the bonding process of a bottom plate according to one embodiment of the present disclosure.

FIG. 13 is a schematic diagram illustrating an example of a bubble evacuation process during the bonding process of a bottom plate according to one embodiment of the present disclosure.

Referring to FIG. 13, even if bubbles B are generated in the process of bonding a back surface of the flat area FA of the bottom plate 300 according to one embodiment with the system middle frame 700 (FIG. 4) via the adhesive 600, the bubbles B can be removed through the bubble venting pattern 350 of the bottom plate 300 by the bonding pressure, thereby preventing screen defects caused by bubbles and improving product yield.

Figure 14:
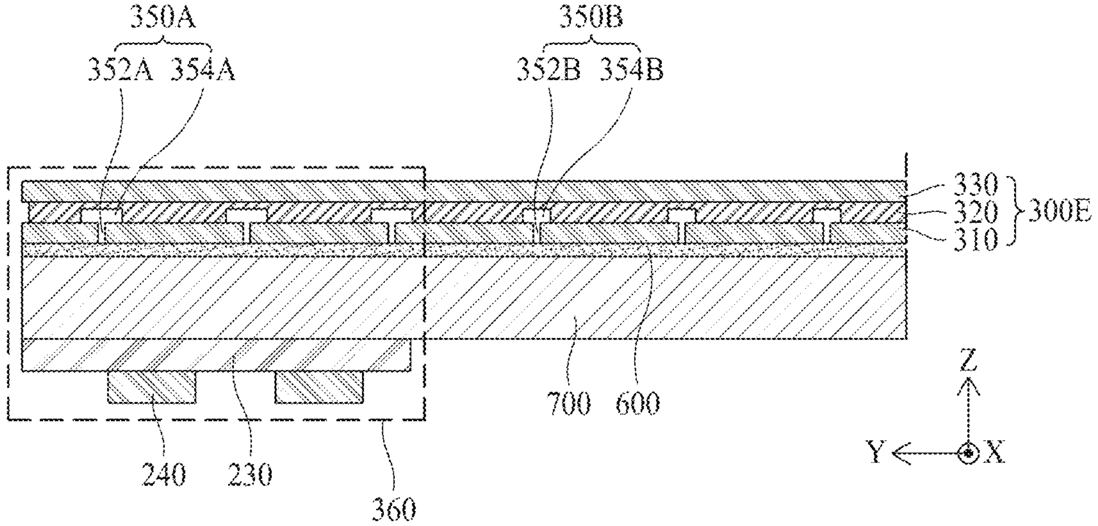
FIG. 14 is a cross-sectional view illustrating an example of an overlapping region of a bottom plate and a driving circuit unit in a foldable display device according to one embodiment of the present disclosure.

FIG. 14 is a cross-sectional view illustrating an example of an overlapping region of a bottom plate and a driving circuit unit in a foldable display device according to one embodiment of the present disclosure.

Referring to FIG. 14, the flat area FA of the bottom plate 300E according to one embodiment may overlap the PCB 230 with the adhesive 600 and the system middle frame 700 therebetween. The bottom plate 300E according to one embodiment may include a first bubble venting pattern (first aperture pattern) 350A disposed in a region 360 of the flat area FA that overlaps with the PCB 230, and a second bubble venting pattern (second aperture pattern) 350B disposed in a remaining region of the flat area FA that is non-overlapping with the PCB 230.

The outer hole pattern 352A of the first bubble venting pattern 350A may have the same or similar width as the outer hole pattern 352B of the second bubble venting pattern 350B. The inner hole pattern 354A of the first bubble venting pattern 350A may have a greater width than the inner hole pattern 354B of the second bubble venting pattern 350B.

Accordingly, the first bubble venting pattern 350A of the bottom plate 300B according to one embodiment may further improve the heat dissipation characteristics for the heat generation of the circuit components 240 on the PCB 230, and thus may reduce the deterioration of the display panel and increase its lifespan, resulting in a low power consumption effect.

FIGS. 15A to 17B are top and bottom views illustrating an example of a structure before and after assembly of a foldable display device according to various embodiments of the present disclosure.

The foldable display modules 500A, 500B, 500C of the foldable display devices 1000A, 1000B, 1000C, according to various embodiments shown in FIGS. 15A to 17B, may include a bottom plate 300E having first and second bubble venting patterns 350A, 350B as shown in FIG. 14.

Figure 15A:
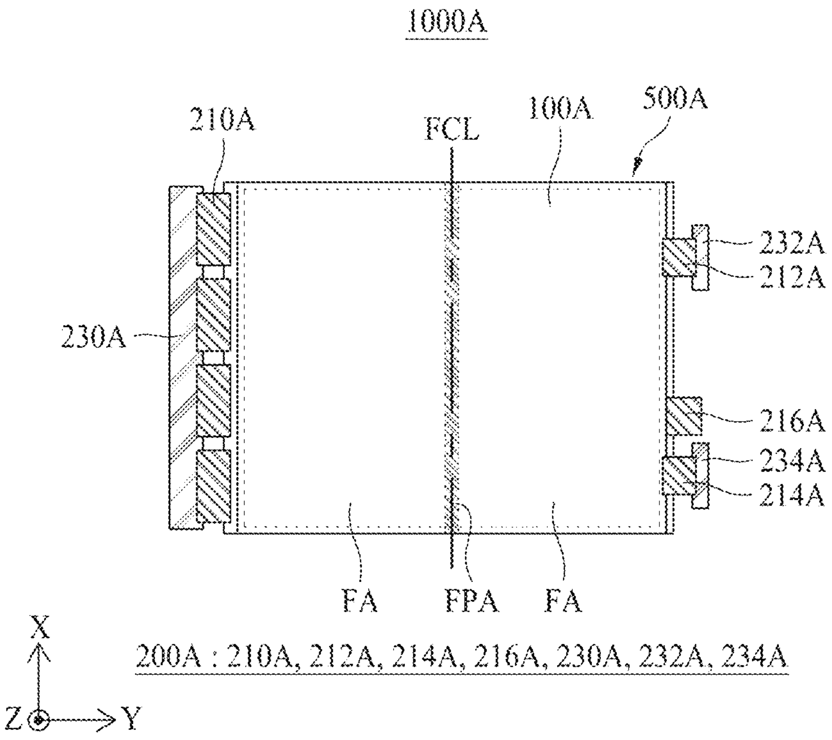
FIGS. 15A to 15B are top and bottom views illustrating an example of a structure before and after assembly of a foldable display device according to one embodiment of the present disclosure.
Figure 15B:
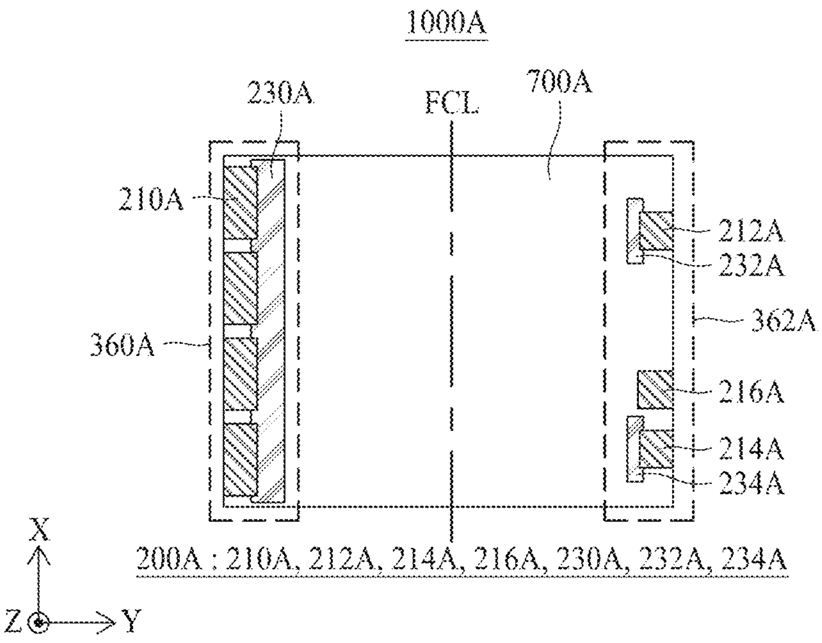

Referring to FIGS. 15A and 15B, the foldable display module 500A of the foldable display device 1000A according to one embodiment may include a plurality of driving circuit units 200A connected to the bezel regions on both sides of the display panel 100A facing in the second direction Y. The first driving circuit unit connected to the first bezel region of the display panel 100A may include a plurality of FPCs 210A and PCBs 230A, and the second driving circuit unit connected to the second bezel region of the display panel 100A may include a plurality of FPCs 212A, 214A, 216A, and a plurality of PCBs 232A, 234A.

After the bottom plate 300E (FIG. 14) of the foldable display module 500A is bonded and assembled with the system middle frame 700A, the FPC 210A and PCB 230A of the first driving circuit unit and the FPCs 212A, 214A, 216A and PCBs 232A, 234A of the second driving circuit unit may be disposed on the back side of the system middle frame 700A to overlap with the display panel 100A.

The bottom plate 300E (FIG. 14) of the foldable display module 500A, according to one embodiment, may include a first bubble venting pattern 350A (FIG. 14) disposed in a region 360A, 362A (corresponding to 360 in FIG. 14) of the flat area FA that overlaps with the first and second driving circuit units of the driving circuit unit 200A, respectively, and a second bubble venting pattern 350B (FIG. 14) disposed in the remaining region of the flat area FA. For example, the inner hole pattern 354A of the first bubble venting pattern 350A may have a larger width than the inner hole pattern 354B of the second bubble venting pattern 350B to further improve the heat dissipation characteristics against heat generation in the driving circuit unit.

Figure 16A:
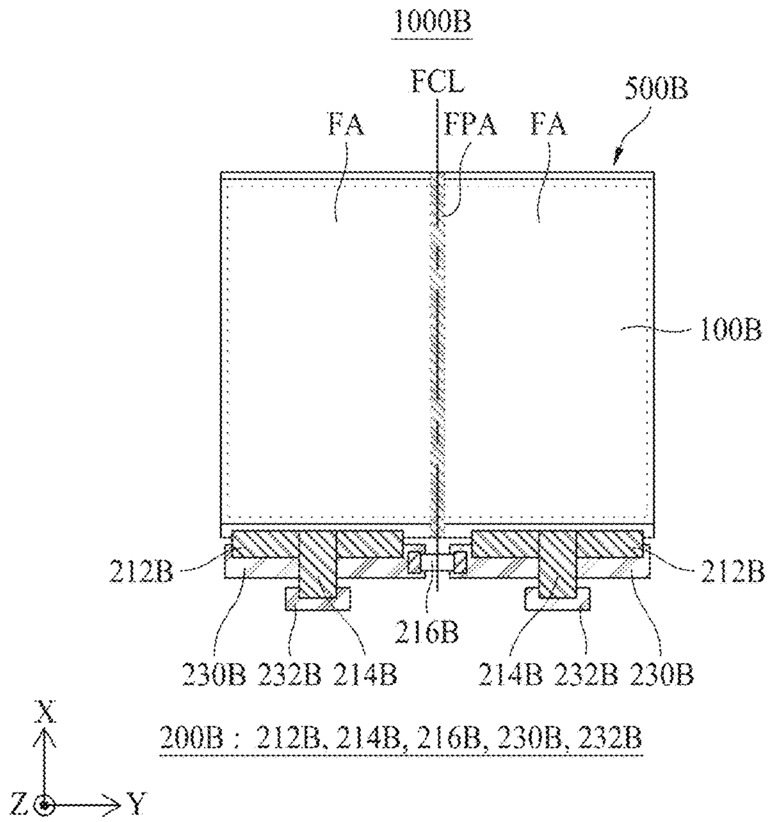
FIGS. 16A to 16B are top and bottom views illustrating an example of a structure before and after assembly of a foldable display device, according to one embodiment of the present disclosure.
Figure 16B:
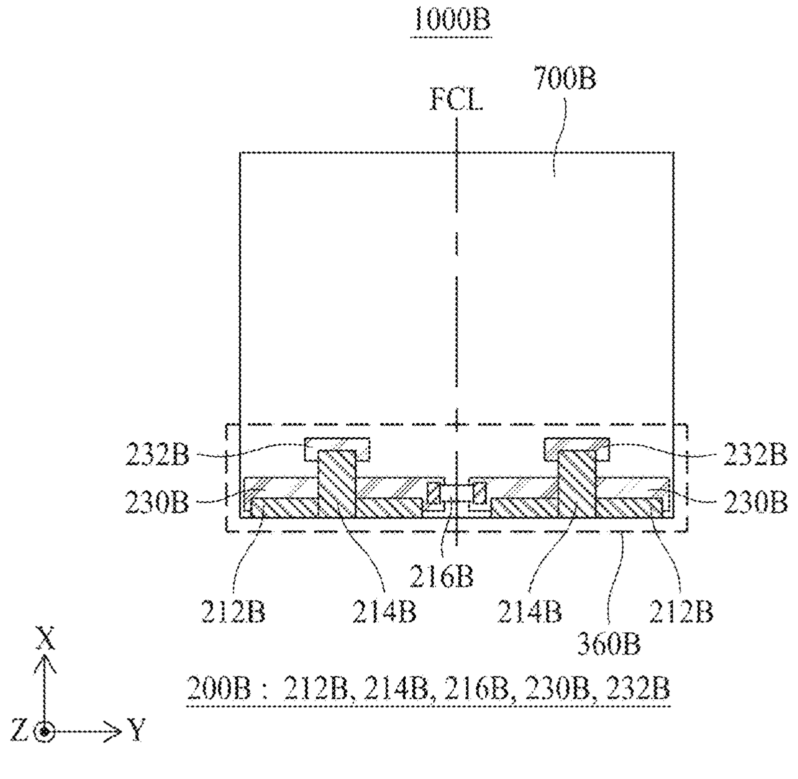

Referring to FIGS. 16A and 16B, the foldable display module 500B of the foldable display device 1000B according to one embodiment may include a driving circuit unit 200B connected to a one-side bezel region of the display panel 100B. The driving circuit unit 200B connected to the one-side bezel region of the display panel 100B may include a plurality of FPCs 212B, 214B, 216B and a plurality of PCBs 230B, 232B.

After the bottom plate 300E (FIG. 14) of the foldable display module 500B is bonded and assembled with the system middle frame 700B, the driving circuit unit 200B may overlap the display panel 100B with the plurality of FPCs 212B, 214B, 216B and the plurality of PCBs 230B, 232B disposed on the back surface of the system middle frame 700B.

The bottom plate 300E (FIG. 14) of the foldable display module 500B, according to one embodiment, includes a first bubble venting pattern 350A (FIG. 14) disposed in a region 360B (corresponding to 360 in FIG. 14) of the flat area FA that overlaps with the driving circuit unit, and a second bubble venting pattern 350B (FIG. 14) disposed in the remaining region of the flat area FA, wherein the inner hole pattern 354A of the first bubble venting pattern 350A has a larger width than the inner hole pattern 354B of the second bubble venting pattern 350B, further improving the heat dissipation characteristics against heat generation of the driving circuit unit.

Figure 17A:
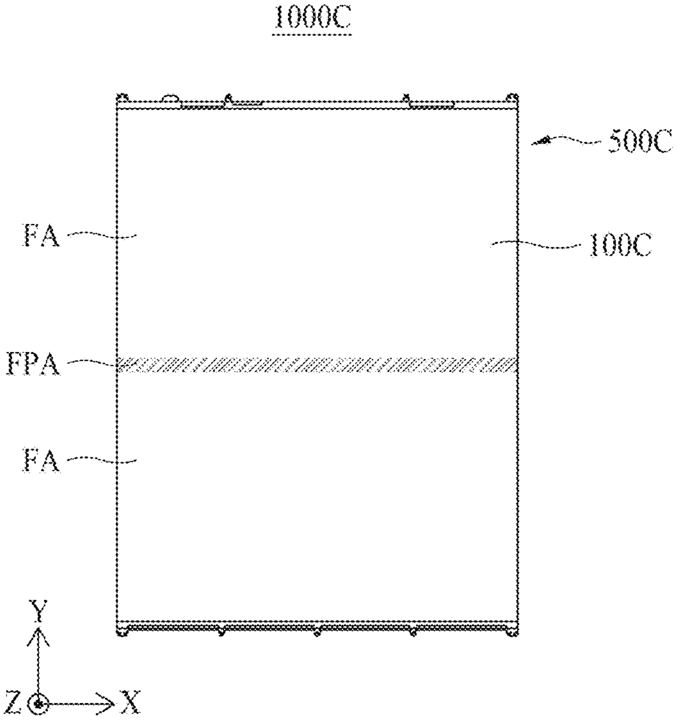
FIGS. 17A to 17B are top and bottom views illustrating an example of a foldable display device, according to one embodiment of the present disclosure.
Figure 17B:
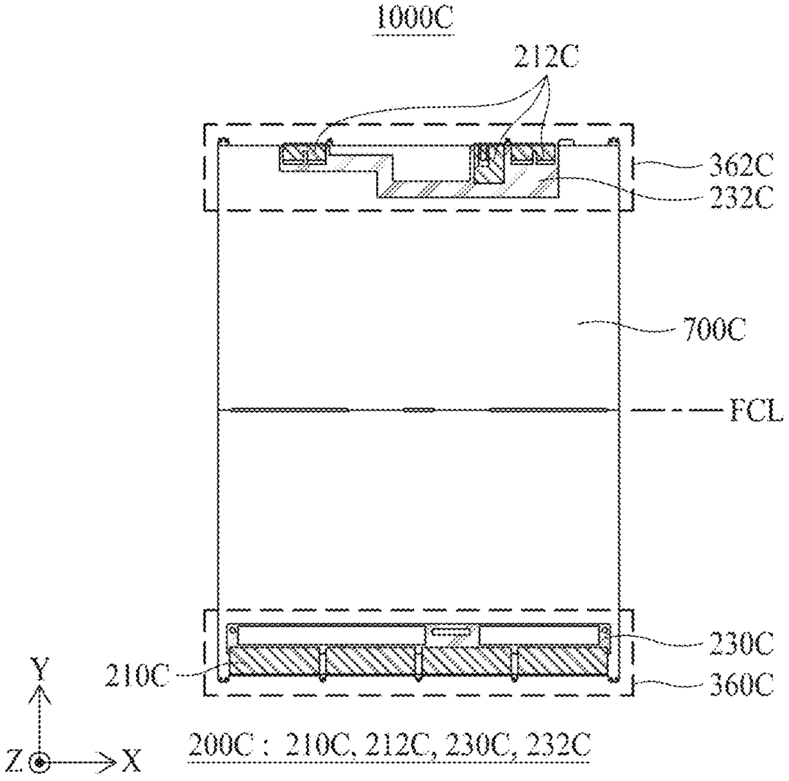

Referring to FIGS. 17A and 17B, the foldable display module 500C of the foldable display device 1000C according to one embodiment may include a plurality of driving circuit units 200C connected to the bezel regions on both sides of the display panel 100C facing in the second direction Y. A first driving circuit unit connected to a first bezel region of the display panel 100C may include a plurality of FPCs 210C and PCBs 230C, and a second driving circuit unit connected to a second bezel region of the display panel 100C may include a plurality of FPCs 212C and PCBs 232C.

After the bottom plate 300E (FIG. 14) of the foldable display module 500C is bonded and assembled with the system middle frame 700C, the FPC 210C and PCB 230C of the first driving circuit unit and the FPC 212C and PCB 232C of the second driving circuit unit may be disposed on the back side of the system middle frame 700C to overlap with the display panel 100C.

The bottom plate 300E (FIG. 14) of the foldable display module 500C according to one embodiment may have a first bubble venting pattern 350A (FIG. 14) disposed in areas 360C, 362C (corresponding to 360 in FIG. 14) of the flat area FA overlapping the first and second driving circuit units of the driving circuit unit 200C, respectively, and a second bubble venting pattern 350B (FIG. 14) disposed in the remaining region of the flat area FA, wherein the inner hole pattern 354A of the first bubble venting pattern 350A has a larger width than the inner hole pattern 354B of the second bubble venting pattern 350B to further improve the heat dissipation characteristics against heat generation of the driving circuit unit.

Figure 18:
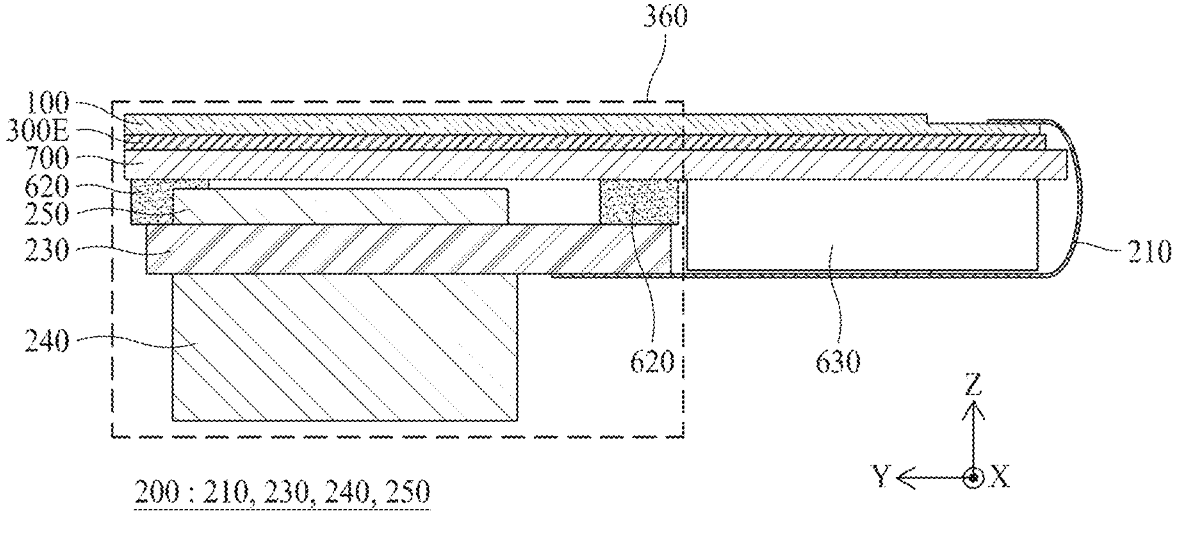
FIG. 18 is a cross-sectional view illustrating an example of an area where a printed circuit board is disposed in a foldable display device according to one embodiment of the present disclosure.

FIG. 18 is a cross-sectional view illustrating an example of an area where a printed circuit board is disposed in a foldable display device according to one embodiment of the present disclosure.

Referring to FIG. 18, in a foldable display device according to one embodiment, a foldable display module including a display panel 100 and a bottom plate 300E is bonded with a system middle frame 700. The circuit film 210 connected to the bezel region of the display panel 100 may be bent toward the back surface of the system middle frame 700 and overlap the back surface of the system middle frame 700 with the reinforcing pad 630 therebetween.

The PCB 230, which is connected to the display panel 100 via the circuit film 210 and has a plurality of drive ICs 240, 250 mounted thereon, may be attached and secured to the back surface of the system middle frame 700 via adhesive 620, As shown in FIG. 14, in the bottom plate 300E according to one embodiment, an inner hole pattern 354A of a first bubble venting pattern 350A disposed in a region 360 of the flat area FA overlapping with the PCB 230 has a larger width than an inner hole pattern 354B of a second bubble venting pattern 350B disposed in a remaining region of the flat area FA non-overlapping with the PCB 230. Accordingly, the heat dissipation characteristics of the circuit components 240, 250 on the PCB 230 can be further improved, thereby reducing the deterioration of the display panel and thereby increasing its lifespan, resulting in a low power consumption effect.

As described above, the foldable display device according to one embodiment can prevent or at least reduce screen defects caused by bubbles even if bubbles are generated in the bonding process of the foldable display module and the system middle frame, by removing the bubbles through an aperture pattern (bubble venting pattern) provided in a flat area of the bottom plate of the foldable display module, and can improve the product yield, thereby achieving the effect of reducing production energy and reducing greenhouse gas emissions.

The foldable display device according to one embodiment has an aperture pattern (bubble venting pattern) of the bottom plate having an outer width that is smaller than the inner width, which can minimize or at least reduce the degradation of the bonding area of the adhesive disposed between the foldable display module and the system middle frame to prevent degradation of the adhesive, thereby preventing or at least reducing the movement of the foldable display module due to vibration or impact, thereby preventing or at least reducing the occurrence of screen wrinkles.

The foldable display apparatus according to one embodiment may utilize a bottom plate having an aperture pattern (bubble venting pattern) to improve the heat dissipation characteristics of the foldable display module. Furthermore, the foldable display device according to one embodiment can further improve the heat dissipation characteristics of the circuit components by providing an inner width of the aperture pattern (bubble venting pattern) of the area overlapping the printed circuit board larger than the inner width of the other part. Thus, the foldable display apparatus according to one embodiment can improve heat dissipation characteristics, which can reduce deterioration of the display panel and thereby increase its lifespan, and as a result, achieve a low power consumption effect.

A foldable display device according to some embodiments may include a system middle frame capable of folding relative to a folding axis; and a foldable display module having a folding area that is bonded with the system middle frame and capable of folding relative to the folding axis, and a plurality of flat areas connected through the folding area, wherein the foldable display module comprises a display panel including the plurality of flat areas and the folding area, and a bottom plate that is bonded between the display panel and the system middle frame and includes a plurality of folding patterns disposed in the folding area and a plurality of aperture patterns disposed in the plurality of flat areas, and wherein each of the plurality of aperture patterns comprising an outer hole pattern and an inner hole pattern associated with the outer hole pattern.

In the foldable display device according to some embodiments, the inner hole pattern may have a width greater than the outer hole pattern in the plurality of aperture patterns.

In the foldable display device according to some embodiments, the bottom plate may include a plurality of metal layers that are stacked, and the outer hole pattern may be provided in an outer metal layer of the plurality of metal layers closest to the system middle frame, and the inner hole pattern may be provided in an inner metal layer of the plurality of metal layers located in an interior of the outer metal layer.

In the foldable display device according to some embodiments, the bottom plate may include first, second and third metal layers that are stacked, and the outer hole pattern may be provided in the first metal layer closest to the system middle frame, and the inner hole pattern may be provided in the second metal layer located in an interior of the first metal layer.

In the foldable display device according to some embodiments, the bottom plate may be overlapped with the plurality of flat areas and may be bonded with a top surface of the system middle frame via a plurality of adhesives in the folding area.

In the foldable display device according to some embodiments, the plurality of flat areas of the bottom plate may include a bonding area where the adhesive is bonded, and a nonbonding area where the adhesive is not bonded by the outer hole pattern, and an area of the boding area may be greater than an area of the nonbonding area.

In the foldable display device according to some embodiments, the plurality of aperture patterns may be arranged in a form of stripes extending in at least one direction of a first direction parallel to the folding axis, a second direction orthogonal to the first direction, and a diagonal direction between said first and second directions, or connected in a matrix form.

In the foldable display device according to some embodiments, the plurality of folding patterns of the bottom plate may have a form of a plurality of slits penetrating the plurality of metal layers and extending in a same direction as the folding axis, and a spacing between the plurality of folding patterns may decrease as it approaches the folding axis of the folding area from the plurality of flat areas.

In the foldable display device according to some embodiments, the foldable display module may further include a driving circuit unit associated with the display panel and disposed on a back surface of the system middle frame.

In the foldable display device according to some embodiments, the plurality of aperture patterns in the bottom plate may include a plurality of first aperture patterns disposed in a first region of the plurality of flat areas overlapping the driving circuit unit, and a plurality of second aperture patterns disposed in a second region of the plurality of flat areas non-overlapping the driving circuit unit and having a different size than the plurality of first aperture patterns.

In the foldable display device according to some embodiments, a first inner hole pattern of the plurality of first aperture patterns may have a larger width than a second inner hole pattern of the plurality of second aperture patterns.

In the foldable display device according to some embodiments, a first outer hole pattern of the plurality of first aperture patterns may have the same or similar width as a second outer hole pattern of the plurality of second aperture patterns.

In the foldable display device according to some embodiments, the driving circuit unit may include a printed circuit board connected to the display panel via a circuit film and mounted with a plurality of driving circuits, and the plurality of first aperture patterns may be disposed in a region overlapping the printed circuit board.

A foldable display device according to some embodiments may include a display panel comprising a plurality of flat areas, and a folding area that is disposed between the plurality of flat areas and capable of folding relative to a folding axis; a bottom plate bonded to a back surface of the display panel, and including a plurality of folding patterns corresponding to the folding area and a plurality of aperture patterns corresponding to the plurality of flat regions, the plurality of aperture patterns comprising an outer hole pattern and an inner hole pattern having a size different from the outer hole pattern; and a system middle frame bonded to the bottom plate by a plurality of adhesives disposed separately on a back surface of the bottom plate corresponding to the plurality of flat areas, and capable of folding relative to the folding axis.

In the foldable display device according to some embodiments, the inner hole pattern may have a width greater than the outer hole pattern.

In the foldable display device according to some embodiments, the bottom plate may include first, second and third metal layers that are stacked, and the outer hole pattern may be provided in the first metal layer bonded to the system middle frame by the plurality of adhesives, and the inner hole pattern may be provided in the second metal layer located in an interior of the first metal layer.

In the foldable display device according to some embodiments, the plurality of aperture patterns may be arranged in a form of stripes extending in at least one direction of a first direction parallel to the folding axis, a second direction orthogonal to the first direction, and a diagonal direction between said first and second directions, or connected in a matrix form.

In the foldable display device according to some embodiments, the plurality of folding patterns of the bottom plate may have a form of a plurality of slits penetrating the bottom plate and extending in the first direction, and a spacing between the plurality of folding patterns may decrease as it approaches the folding axis of the folding area from the plurality of flat areas.

The foldable display device may further include a driving circuit unit associated with the display panel and disposed on a back surface of the system middle frame. The plurality of aperture patterns in the bottom plate may include a plurality of first aperture patterns disposed in a first region of the plurality of flat areas overlapping the driving circuit unit, and a plurality of second aperture patterns disposed in a second region of the plurality of flat areas non-overlapping the driving circuit unit and having a different size than the plurality of first aperture patterns.

In the foldable display device according to some embodiments, a first inner hole pattern of the plurality of first aperture patterns may have a larger width than a second inner hole pattern of the plurality of second aperture patterns.

In the foldable display device according to some embodiments, a first outer hole pattern of the plurality of first aperture patterns may have the same or similar width as a second outer hole pattern of the plurality of second aperture patterns.

In the foldable display device according to some embodiments, the driving circuit unit may include a printed circuit board connected to the display panel via a circuit film and mounted with a plurality of driving circuits, and the plurality of first aperture patterns may be disposed in a region overlapping the printed circuit board.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A display device comprising:

a system middle frame configured to fold relative to a folding axis; and a foldable display module having a folding area that is bonded to the system middle frame and configured to fold relative to the folding axis, and a plurality of flat areas connected through the folding area, wherein the foldable display module comprises:

a display panel including the plurality of flat areas and the folding area, and a bottom plate that is bonded between the display panel and the system middle frame, the bottom plate including a plurality of folding patterns in the folding area and a plurality of aperture patterns in the plurality of flat areas, wherein each of the plurality of aperture patterns comprises an outer hole pattern and an inner hole pattern associated with the outer hole pattern, wherein the bottom plate comprises a plurality of metal layers that are stacked, and wherein the outer hole pattern is in an outer metal layer of the plurality of metal layers that is closest to the system middle frame, and the inner hole pattern is in an inner metal layer of the plurality of metal layers located in an interior of the outer metal layer.

2. The display device according to claim 1, wherein the inner hole pattern has a width that is greater than a width of the outer hole pattern in the plurality of aperture patterns.

3. The display device according to claim 1, wherein the bottom plate comprises a first metal layer, a second metal layer, and a third metal layer that are stacked, and wherein the outer hole pattern is in the first metal layer closest to the system middle frame, and the inner hole pattern is in the second metal layer located in an interior of the first metal layer.

4. The display device according to claim 1, wherein the bottom plate overlaps with the plurality of flat areas and is bonded to a top surface of the system middle frame via a plurality of adhesives in the folding area.

5. The display device according to claim 4, wherein the plurality of flat areas of the bottom plate comprise a bonding area where the plurality of adhesives are bonded, and a nonbonding area where the plurality of adhesives are not bonded by the outer hole pattern, and wherein an area of the bonding area is greater than an area of the nonbonding area.

6. The display device according to claim 1, wherein the plurality of aperture patterns include stripes extending in at least one direction of a first direction parallel to the folding axis, a second direction orthogonal to the first direction, and a diagonal direction between the first direction and the second direction, or connected in a matrix form.

7. The display device according to claim 1, wherein the plurality of folding patterns of the bottom plate include a plurality of slits penetrating the plurality of metal layers and extending in a same direction as the folding axis, and wherein a spacing between the plurality of folding patterns decreases as the plurality of folding patterns approach the folding axis of the folding area from the plurality of flat areas.

8. The display device according to claim 1, wherein the foldable display module further comprises a driving circuit associated with the display panel and on a back surface of the system middle frame.

9. The display device according to claim 8, wherein the plurality of aperture patterns in the bottom plate comprise:

a plurality of first aperture patterns in a first region of the plurality of flat areas overlapping the driving circuit; and a plurality of second aperture patterns in a second region of the plurality of flat areas non-overlapping the driving circuit, the plurality of second aperture patterns having a size that is different from a size of the plurality of first aperture patterns.

10. The display device according to claim 9, wherein a first inner hole pattern of the plurality of first aperture patterns has a width that is larger than a width of a second inner hole pattern of the plurality of second aperture patterns.

11. The display device according to claim 9, wherein a first outer hole pattern of the plurality of first aperture patterns has a same width as a second outer hole pattern of the plurality of second aperture patterns.

12. The display device according to claim 9, wherein the driving circuit comprises a printed circuit board connected to the display panel via a circuit film and mounted with a plurality of driving circuits, and wherein the plurality of first aperture patterns are in a region overlapping the printed circuit board.

13. A display device comprising:

a display panel comprising a plurality of flat areas, and a folding area that is between the plurality of flat areas and configured to fold relative to a folding axis;

a bottom plate bonded to a back surface of the display panel, the bottom plate including a plurality of folding patterns corresponding to the folding area and a plurality of aperture patterns corresponding to the plurality of flat areas, the plurality of aperture patterns comprising an outer hole pattern and an inner hole pattern having a size that is different from a size of the outer hole pattern;

a system middle frame bonded to the bottom plate by a plurality of adhesives disposed separately on a back surface of the bottom plate corresponding to the plurality of flat areas, the system middle frame configured to fold relative to the folding axis; and a driving circuit associated with the display panel and disposed on a back surface of the system middle frame, wherein the plurality of aperture patterns in the bottom plate comprise:

a plurality of first aperture patterns in a first region of the plurality of flat areas overlapping the driving circuit; and a plurality of second aperture patterns in a second region of the plurality of flat areas non-overlapping the driving circuit, the plurality of second aperture patterns having a size that is different from a size of the plurality of first aperture patterns.

14. The display device according to claim 13, wherein the inner hole pattern has a width that is greater than a width of the outer hole pattern.

15. The display device according to claim 14, wherein the bottom plate comprises a first metal layer, a second metal layer, and a third metal layer that are stacked, and wherein the outer hole pattern is in the first metal layer bonded to the system middle frame by the plurality of adhesives, and the inner hole pattern is in the second metal layer located in an interior of the first metal layer.

16. The display device according to claim 13, wherein the plurality of aperture patterns include stripes extending in at least one direction of a first direction parallel to the folding axis, a second direction orthogonal to the first direction, and a diagonal direction between the first direction and the second direction, or connected in a matrix form.

17. The display device according to claim 16, wherein the plurality of folding patterns of the bottom plate include a plurality of slits penetrating the bottom plate and extending in the first direction, and wherein a spacing between the plurality of folding patterns decreases as the plurality of folding patterns approach the folding axis of the folding area from the plurality of flat areas.

18. The display device according to claim 13, wherein a first inner hole pattern of the plurality of first aperture patterns has a width that is larger than a width of a second inner hole pattern of the plurality of second aperture patterns.

19. The display device according to claim 13, wherein a first outer hole pattern of the plurality of first aperture patterns has a same width as a second outer hole pattern of the plurality of second aperture patterns.

20. The display device according to claim 18, wherein the driving circuit comprises a printed circuit board connected to the display panel via a circuit film and mounted with a plurality of driving circuits, and wherein the plurality of first aperture patterns are in a region overlapping the printed circuit board.

* * * * *